United States Patent
Saito et al.

(10) Patent No.: US 7,102,097 B2
(45) Date of Patent: Sep. 5, 2006

(54) METHOD OF MAKING HOLE IN CERAMIC GREEN SHEET

(75) Inventors: Ryuichi Saito, Osaka (JP); Michihisa Sanda, Osaka (JP); Hidefumi Saeki, Osaka (JP); Hidenori Katsumura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 189 days.

(21) Appl. No.: 10/688,963

(22) Filed: Oct. 21, 2003

(65) Prior Publication Data

US 2004/0129689 A1    Jul. 8, 2004

(30) Foreign Application Priority Data

Oct. 22, 2002    (JP) ............................. 2002-306927

(51) Int. Cl.
*B23K 26/00* (2006.01)
(52) U.S. Cl. .............................. 219/121.71; 219/121.7; 219/121.85
(58) Field of Classification Search ........... 219/121.71, 219/121.7, 121.85, 121.78
See application file for complete search history.

(56) References Cited

U.S. PATENT DOCUMENTS

| | | | | |
|---|---|---|---|---|
| 3,742,182 A | * | 6/1973 | Saunders | ............... 219/121.71 |
| 4,114,018 A | * | 9/1978 | Von Allmen et al. | ... 219/121.69 |
| 5,168,454 A | * | 12/1992 | LaPlante et al. | ............ 700/166 |
| 6,172,330 B1 | * | 1/2001 | Yamamoto et al. | ....... 219/121.7 |
| 6,270,601 B1 | * | 8/2001 | Ritland et al. | ........... 156/89.12 |
| 6,281,471 B1 | * | 8/2001 | Smart | .................... 219/121.62 |
| 6,359,255 B1 | * | 3/2002 | Yamamoto et al. | .... 219/121.71 |
| 6,521,866 B1 | | 2/2003 | Arai et al. | |
| 6,800,237 B1 | * | 10/2004 | Yamamoto et al. | ......... 264/400 |

FOREIGN PATENT DOCUMENTS

JP    01-9691    1/1989

* cited by examiner

*Primary Examiner*—M. Alexandra Elve
(74) *Attorney, Agent, or Firm*—Wenderoth, Lind & Ponack, L.L.P.

(57) ABSTRACT

A ceramic green sheet is irradiated with a laser beam of a high-peak short-pulse type to form a hole in the sheet. With the laser beam, a minimum oscillation output is more than 60% of a maximum oscillation output. This prevents material of the ceramic green sheet from melting partially and remaining around the hole. Therefore, a multi-layer assembly of ceramic green sheets built by joining the sheets in layers and baking these joined sheets hardly has a structural defect around a via-electrode provided in the hole.

14 Claims, 3 Drawing Sheets

METHOD OF MAKING HOLE IN CERAMIC GREEN SHEET

FIELD OF THE INVENTION

The present invention relates to a method of making a hole in a ceramic green sheet used for manufacturing a ceramic device, such as a ceramic multi-layer device.

BACKGROUND OF THE INVENTION

A ceramic multi-layer device, such as a small filter or a module component, is often manufactured by stacking ceramic green sheets one over another. During this manufacturing, the ceramic green sheets are provided at their surfaces with patterns of wiring by screen printing the patterns, the sheets are assembled in layers, the sheets are baked, and the sheets are divided into pieces of ceramic multi-layer devices. The ceramic green sheets are ceramic layers to construct a ceramic multi-layer device.

Patterns of wiring provided on both sides of a ceramic layer are connected to each other by a via-electrode extending across the ceramic layer. The via-electrode is fabricated by filling a via-hole in a ceramic green sheet with paste of electrically conductive material and then by baking the paste. The ceramic green sheets may be doped with additive, such as glass, for baking the sheets at a low temperature.

As required to have a small overall size and an improved performance, the ceramic multi-layer devices are demanded to have larger number of these via-holes, made in the ceramic green sheets, having small diameters, in a shorter time.

The via-holes are made by punching the ceramic green sheets with a die. The smaller the diameters of the via holes, the shorter an operating life of the die, and pins of the die, are. This punching does not provide via-holes having diameters smaller than 100 µmϕ easily, and provides via-holes at a small processing speed.

As disclosed in Japanese Patent Laid-Open Publication No.01-9691, via-holes may favorably be made by utilizing a laser beam of $CO_2$, YAG, or excimer. This method can provide via-holes having diameters smaller than 100 µmϕ easily while not requiring particular maintenance operations, such as a change of a die.

The laser beam can make the via-holes fast by repetitively irradiating a ceramic green sheet with the laser beam with a galvano-scan mirror having a reflecting angle controlled by electronic control without movement of the ceramic green sheet. This allows the via-holes to be provided at a speed substantially 100 times larger than that of the punching.

FIG. 8 is a cross sectional view of a baked ceramic assembly in a conventional method. FIG. 9 illustrates a conventional via-hole.

In this technique using a laser beam, a ceramic green sheet containing particularly glass material may include a melting portion of the glass material while being irradiated with the laser beam to provide via holes. The melting portion of the glass material appears as a melting substance 17 remaining at an edge of via-hole 16, as shown in FIG. 9.

The melting substance 17 prevents the via-hole 16 from being filled with paste of electrically conductive material at a succeeding process for fabricating via-electrode 12. Portions around the via-hole 16 in the ceramic green sheet may deteriorate by heat of the laser beam, hence significantly deteriorating a joining tightness and wet property between the electrically conductive material paste and the ceramic green sheet.

A baked ceramic assembly 10 is provided by forming the via-holes 16 in the ceramic green sheets by utilizing the laser beam, filling the via-holes 16 with the electrically conductive material paste, assembling the sheets in layers, and baking the sheets. As shown in FIG. 8, the baked ceramic assembly 10 may have a structural defect 13, such as a cavity, around via-electrode 12. This defect reduces a connecting property as well as resistance to moisture, thus reducing long-term operational reliability of a manufactured ceramic multi-layer device.

SUMMARY OF THE INVENTION

A surface of a ceramic green sheet is irradiated with laser beam of a substantially square waveform pulse in which a minimum of an output is 60% of a maximum of the output to provide a through-hole in the ceramic green sheet. This method prevents a portion of material of the ceramic green sheet from melting and being burred around the hole.

DETAILED DESCRIPTION OF THE PREFERRED EMBODIMENTS

Exemplary Embodiment 1

Figure 1:
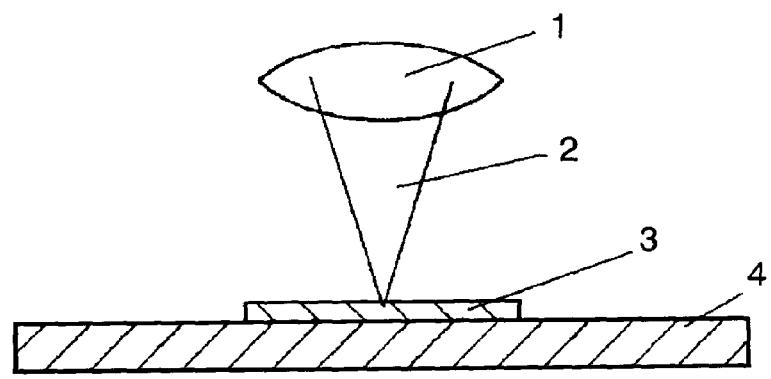
FIG. 1 illustrates a method of making a hole in a ceramic green sheet according to Exemplary Embodiment 1 of the present invention.
Figure 2:
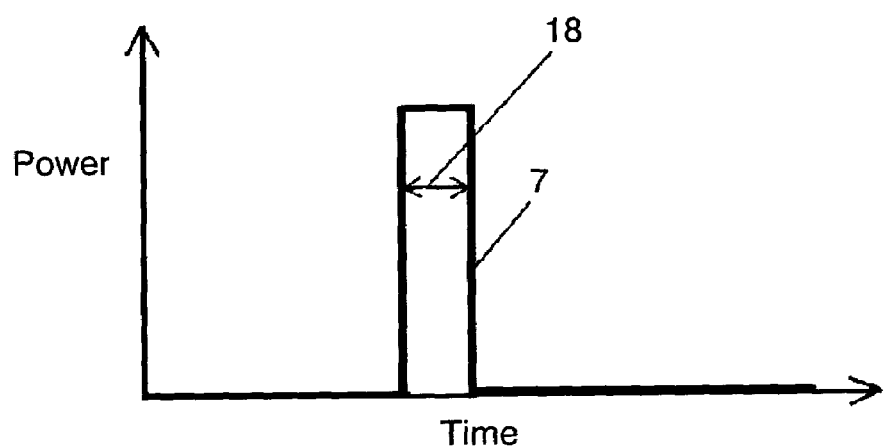
FIG. 2 illustrates a waveform of a high-peak short-pulse laser beam used in the method of Exemplary Embodiment 1.
Figure 4:
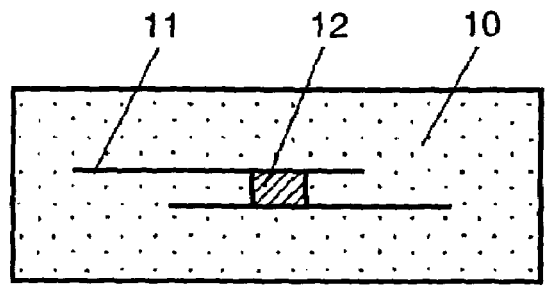
FIG. 4 is a cross sectional view of a baked ceramic assembly in the method of Exemplary Embodiment 1.

FIG. 1 illustrates a method of making a hole in a ceramic green sheet according to Exemplary Embodiment 1 of the present invention. FIG. 2 illustrates a waveform of a high-peak short-pulse laser beam used in the method. FIG. 4 is a cross sectional view of a baked ceramic assembly in the method of Exemplary Embodiment 1.

Ceramic slurry is prepared by mixing a non-organic combination of ceramic powder, mainly containing $Al_2O_3$, and silicate glass, including alkali earth metal oxide, with organic binder, plasticizer, and solvent. The ceramic slurry is then applied over a carrier film with a doctor blade, thus providing a wet ceramic green sheet. The wet ceramic green sheet is then continuously dried to provide a ceramic green sheet 3. The carrier film may be, but not limited to, made of polyethylene terephthalate (PET).

Then, the ceramic green sheet 3 is placed on an X-Y table 4 of a laser processing machine and irradiated with laser beam 2 having a square pulse waveform and focused by a condenser lens 1, thus providing a through-hole.

The laser beam 2 is a high-peak short-pulse laser beam having a square pulse waveform 7 shown in FIG. 2.

Figure 3:
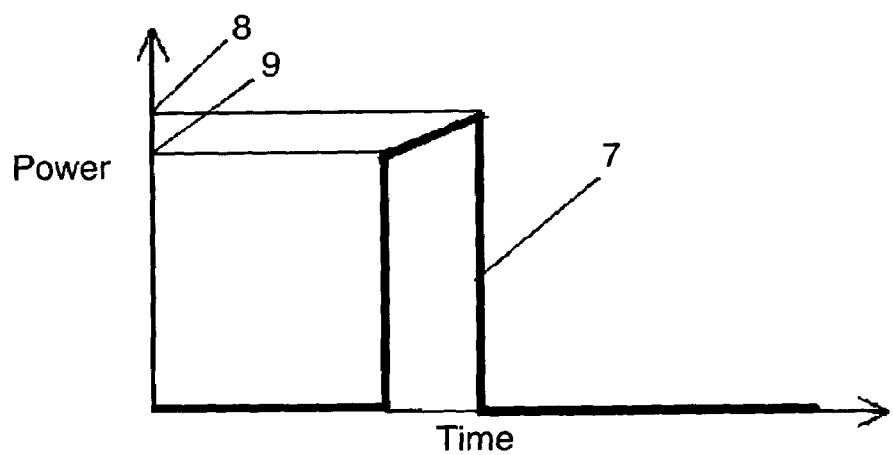
FIG. 3 illustrates a waveform of a high-peak short-pulse laser beam used in the method of Exemplary Embodiment 1.

FIG. 2 illustrates an ideal shape of the pulse waveform 7. The pulse waveform 7 shown in FIG. 3 shows an actual shape of the high-peak short-pulse laser beam 2 reaching the ceramic green sheet 3. The pulse waveform 7, particularly in which minimum power 9 is not smaller than 60% of maximum power 8, provides a hole having a preferable shape, an easy control of conditions for irradiating, and a small amount of a remaining substance around the hole.

Figure 7:
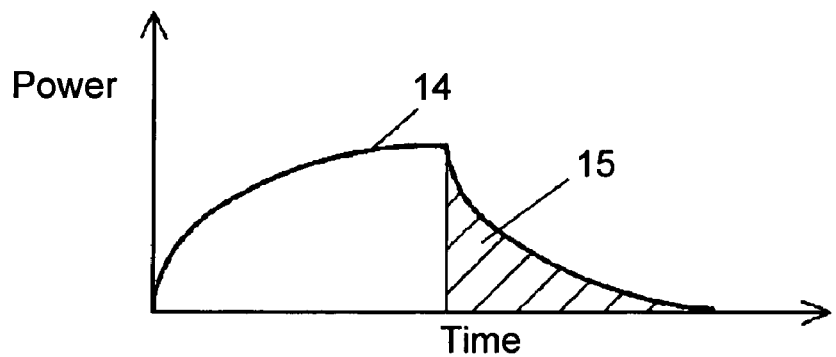
FIG. 7 illustrates a waveform of a pulse laser beam in a conventional method.

FIG. 7 illustrates a pulse waveform 14 of a $CO_2$ laser beam in a conventional method. By having a small peak output of 500 W, the $CO_2$ laser beam needs to have a long pulse width for providing a hole. The pulse waveform 14 in the conventional method has a long rising time. It takes some tens of microseconds until an output of the laser beam becomes zero after turning off the laser beam, hence creating a domain 15 where oscillation output is not controlled. The longer the pulse width, the greater the domain 15 becomes. Accordingly, the laser beam in the conventional method does not control oscillation output and pulse width easily, and can hardly be determined to desired settings for a process.

By having a small peak output, the laser beam in the conventional method has a pulse width increased to provide a desired shape of the hole and provides a thermal influence to an edge of the hole 16 in the ceramic green sheet 3.

Figure 8:
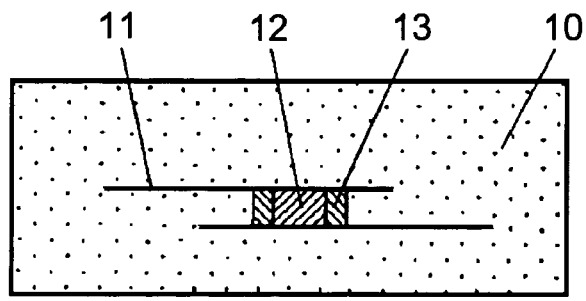
FIG. 8 is a cross sectional view of a conventional baked ceramic assembly.

As a result, the ceramic green sheet 3 containing glass material is not sufficiently heated up at the edge of the hole 16, and a melting portion 17 may remain around the hole 16 when being cooled down. If a baked ceramic assembly 10 is fabricated from ceramic green sheets 3 having such an unfavorable hole, the assembly 10 may include a structural defect 13 around via-electrode 12, as shown in FIG. 8.

Figure 9:
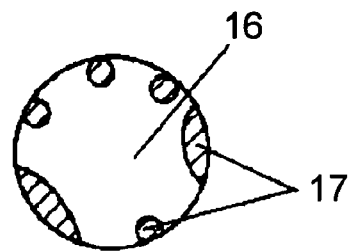
FIG. 9 illustrates a conventionally formed via-hole.

In order to prevent the melting portion 17 shown in FIG. 9 from remaining around the hole 16, a peak output of the high-peak short-pulse laser beam is preferably more than 700 W. A duration from that oscillation of the laser beam being turned off to when the output becomes zero is preferably not longer than 2 microseconds. A pulse width 18 may preferably be controlled to be shorter than 2 microseconds.

An amount of the melting substance 17 shown in FIG. 9 becomes small if a cycle of heating and cooling is not repeated many times. The ceramic green sheet 3 may be preferably irradiated with the laser beam 2 not more than three times.

The ceramic green sheet 3 is provided with through hole 16 therein, and then, a paste of electrically conductive material is applied to fill the hole 16, thus providing the via-electrode 12.

Then, patterns 11 of wiring are printed on the ceramic green sheets 3. Ceramic green sheets 3 having wiring patterns 11 thereon are stacked one on another and joined together by a thermal bonding technique to provide a ceramic green sheet block.

The ceramic green sheet block is then degreased at a temperature ranging from 350 to 600° C. and baked at a temperature ranging from 850 to 950° C. to provide a baked ceramic assembly 10 shown in FIG. 4.

The baked ceramic assembly 10 is provided with a SAW filter and other chip components mounted thereon by performing a surface mounting technique, and is then divided by dicing or breaking up into desired sizes of multi-layer ceramic devices.

According to Exemplary Embodiment 1, material of ceramic green sheet 3 is not limited to a combination of ceramic powder essentially containing $Al_2O_3$ and silicate glass including alkali earth metal oxide. The method of Exemplary Embodiment 1 is specifically effective to making a through-hole in a sheet of a low-temperature baking ceramic material, which can be baked at a temperature lower than 1000° C. since the material often provides a melting substance by laser beam.

Exemplary Embodiment 2

Figure 5:
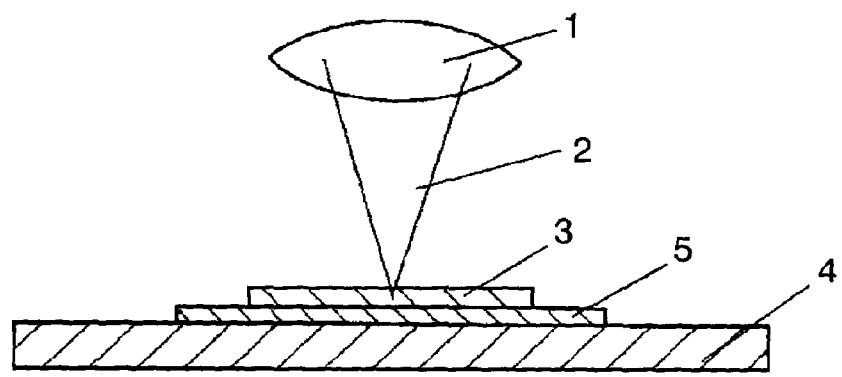
FIG. 5 illustrates a method of making a hole in a ceramic green sheet according to Exemplary Embodiment 2 of the invention.
Figure 6:
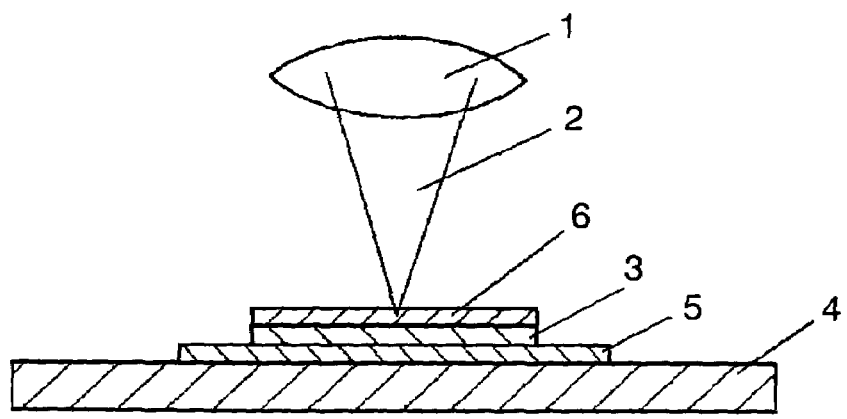
FIG. 6 illustrates the method of making a hole in a ceramic green sheet according to Exemplary Embodiment 2.

FIGS. 5 and 6 are schematic views showing a method for making a hole in a ceramic green sheet 3 according to Exemplary Embodiment 2 of the invention. Preparation of ceramic green sheets 3 and fabrication of a multi-layer ceramic device are identical to those of Exemplary Embodiment 1 and will be described in no more detail.

According to Exemplary Embodiment 2, the ceramic green sheet 3 is supported by a carrier film 5 and placed on an X-Y table 4. A side of the ceramic green sheet 3 opposite to the carrier film 5 is irradiated with laser beam 2 as shown in FIGS. 2 and 3 for making a hole 16 in the sheet.

This method allows the ceramic green sheet 3, even if being thin, to be supported by the carrier film 5, thus making holes in the sheet continuously and thereby increasing productivity.

When the ceramic green sheet 3 is irradiated particularly directly with the laser beam 2, a surface of the sheet may be polluted with a melting substance.

For protecting the surface, the ceramic green sheet 3 may preferably be coated with a resin film 6, such as an adhesive coated PET film, as shown in FIG. 6.

The resin film 6 may not be coated with an adhesive layer if it is attached securely to the surface of the ceramic green sheet 3. Material of the resin film 6 is not limited to PET.

Table 1 illustrates a relationship between energy of the laser beam 2 of a high-peak short-pulse laser and a status of the hole made by the laser beam 2.

TABLE 1

| Energy (mJ) | 1 | 2 | 5 | 10 | 20 | 30 | 50 | 60 |
|---|---|---|---|---|---|---|---|---|
| Removed Volume ($\times 10^5$ mm$^3$) | 4 | 5 | 12 | 25 | 50 | 70 | 120 | Not Measurable |
| Status | (*1) | No Problem | No Problem | No Problem | No Problem | No Problem | No Problem | (*2) |

(*1): The edge of the hole was tapered.
(*2): The green sheet was broken, or the film was peeled off.

As shown in Table 1, an excessively-large power of energy provides a breaking of the ceramic green sheet 3, fusion of the ceramic green sheet 3 and the carrier film 5, and removal of the ceramic green sheet 3 from the carrier film 5. This may cause a short-circuiting during application of electrically conductive paste in a later step, and prevents the carrier film 5 from being removed properly from the green sheet 3 in a later step.

When the energy of the laser beam 2 is too small, an edge at both, upper and lower, openings of the hole 16 is tapered. Accordingly, the hole 16 is hardly formed to have a desired shape, and has a large amount of melting substance 17.

The energy of the high-peak short-pulse laser beam 2 preferably ranges from 2 to 50 mJ as seen from Table 1.

If the ceramic green sheet 3 is irradiated through the carrier film 5 with the laser beam 2, a diameter of a resultant hole may have a diameter at a surface facing the side opposite to the carrier film 5 smaller than a diameter at the surface facing the film 5. In this case, electrically conductive paste filled in the hole for forming via-electrode 12 is attached to the carrier film 5 and removed from the ceramic green sheet 3 together with the carrier film 5 when the film 5 is detached from the ceramic green sheet 3. If the ceramic green sheet 3 is thin, a surface of the sheet opposite to the carrier film 5 is preferably irradiated with the laser beam 2.

As set forth above, the methods of making holes according to Exemplary Embodiments 1 and 2 reduce an amount of a melting substance around the hole generated by the laser beam. The method reduces a structural defect near a via-electrode, thus assuring operational reliability of a resultant multi-layer ceramic device.

The invention claimed is:

1. A method of making a hole in a ceramic green sheet, comprising:
   preparing a ceramic green sheet, capable of being baked at a temperature lower than 1000° C., including ceramic powder mainly and silicate glass; and
   irradiating a first surface of said ceramic green sheet with a laser beam, having a substantially square pulse shape having a minimum power that is more than 60% of a maximum power, so as to make a hole in said first surface such that a protruding portion of silicate glass is not present in said ceramic green sheet around said hole.

2. The method according to claim 1, wherein
   irradiating a first surface of said ceramic green sheet with a laser beam comprises irradiating said first surface of said ceramic green sheet with a laser beam having an oscillation output that is not smaller than 700 W.

3. The method according to claim 1, wherein
   irradiating a first surface of said ceramic green sheet with a laser beam comprises irradiating said first surface of said ceramic green sheet with a laser beam for which oscillation thereof can be controlled for not longer than 2 microseconds.

4. The method according to claim 1, wherein
   irradiating a first surface of said ceramic green sheet with a laser beam comprises irradiating said first surface of said ceramic green sheet with said laser beam not more than three times.

5. The method according to claim 1, wherein
   irradiating a first surface of said ceramic green sheet with a laser beam comprises irradiating said first surface of said ceramic green sheet with a laser beam having an energy that ranges from 2 mJ to 50 mJ.

6. The method according to claim 1, wherein
   preparing a ceramic green sheet comprises preparing a ceramic green sheet having a second surface thereof coated with a carrier film.

7. The method according to claim 1, wherein
   preparing a ceramic green sheet comprises preparing a ceramic green sheet having said first surface coated with a protective film.

8. The method according to claim 1, wherein
   preparing a ceramic green sheet including ceramic powder mainly and silicate glass comprises preparing a ceramic green sheet including said ceramic powder and silicate glass including an alkali earth metal oxide.

9. The method according to claim 8, wherein
   irradiating a first surface of said ceramic green sheet with a laser beam comprises irradiating said first surface of said ceramic green sheet with a laser beam having an oscillation output that is not smaller than 700 W.

10. The method according to claim 8, wherein
    irradiating a first surface of said ceramic green sheet with a laser beam comprises irradiating said first surface of said ceramic green sheet with a laser beam for which oscillation thereof can be controlled for not longer than 2 microseconds.

11. The method according to claim 8, wherein
    irradiating a first surface of said ceramic green sheet with a laser beam comprises irradiating said first surface of said ceramic green sheet with said laser beam not more than three times.

12. The method according to claim 8, wherein
    irradiating a first surface of said ceramic green sheet with a laser beam comprises irradiating said first surface of said ceramic green sheet with a laser beam having an energy that ranges from
2 mJ to 50 mJ.

13. The method according to claim 8, wherein
    preparing a ceramic green sheet comprises preparing a ceramic green sheet having a second surface thereof coated with a carrier film.

14. The method according to claim 8, wherein
    preparing a ceramic green sheet comprises preparing a ceramic green sheet having said first surface coated with a protective film.

* * * * *